United States Patent
Rotsch

(10) Patent No.: US 7,385,676 B2
(45) Date of Patent: Jun. 10, 2008

(54) MASK SET HAVING SEPARATE MASKS TO FORM DIFFERENT REGIONS OF INTEGRATED CIRCUIT CHIPS, EXPOSURE SYSTEM INCLUDING THE MASK SET WITH AN APERTURE DEVICE, AND METHOD OF USING THE MASK SET TO EXPOSE A SEMICONDUCTOR WAFER

(75) Inventor: Christian Rotsch, München (DE)

(73) Assignee: Infineon Technologies AG, Munich (DE)

( * ) Notice: Subject to any disclaimer, the term of this patent is extended or adjusted under 35 U.S.C. 154(b) by 579 days.

(21) Appl. No.: 10/852,661

(22) Filed: May 25, 2004

(65) Prior Publication Data

US 2005/0003279 A1    Jan. 6, 2005

(30) Foreign Application Priority Data

May 26, 2003   (DE)   ................. 103 24 502

(51) Int. Cl.
    G03B 27/54    (2006.01)
    G03F 7/20     (2006.01)
    G03F 1/00     (2006.01)
    G03F 1/14     (2006.01)
(52) U.S. Cl. ..................... 355/67; 430/5; 430/311
(58) Field of Classification Search .............. 430/5, 430/311; 355/67
    See application file for complete search history.

(56) References Cited

U.S. PATENT DOCUMENTS

| | | | | |
|---|---|---|---|---|
| 4,985,634 A | * | 1/1991 | Stengl et al. | 250/492.2 |
| 5,036,209 A | * | 7/1991 | Kataoka et al. | 250/492.2 |
| 5,670,428 A | * | 9/1997 | Beilstein et al. | 438/462 |
| 5,807,649 A | * | 9/1998 | Liebmann et al. | 430/5 |
| 6,192,290 B1 | | 2/2001 | Adams | 700/121 |
| 6,537,867 B1 | * | 3/2003 | Freyman et al. | 430/394 |
| 2002/0006555 A1 | * | 1/2002 | Hasegawa et al. | 430/5 |
| 2002/0045136 A1 | * | 4/2002 | Fritze et al. | 430/5 |
| 2003/0219655 A1 | * | 11/2003 | Sutani et al. | 430/5 |

* cited by examiner

Primary Examiner—Mark F. Huff
Assistant Examiner—John Ruggles
(74) Attorney, Agent, or Firm—Slater & Matsil, L.L.P.

(57) ABSTRACT

A mask set for the production of integrated circuit chips, wherein a first mask has first features that form inner cell regions and a second mask has second features that form outer non-cell regions, so that the first and second masks do no expose a same region of a semiconductor wafer. An exposure system includes the mask set with an aperture device to fade out partial regions of the first features during exposure of the wafer by a light source. Furthermore, the mask set is used in a method of exposing a wafer for producing integrated circuit chips.

29 Claims, 4 Drawing Sheets

MASK SET HAVING SEPARATE MASKS TO FORM DIFFERENT REGIONS OF INTEGRATED CIRCUIT CHIPS, EXPOSURE SYSTEM INCLUDING THE MASK SET WITH AN APERTURE DEVICE, AND METHOD OF USING THE MASK SET TO EXPOSE A SEMICONDUCTOR WAFER

CLAIM FOR PRIORITY

This application claims the benefit of priority to German Application No. 103 24 502.2, filed in the German language on May 26, 2003, the contents of which are hereby incorporated by reference.

TECHNICAL FIELD OF THE INVENTION

The invention relates to a mask, in particular a photomask, for producing semiconductor devices, and to a method for producing semiconductor devices by means of such type of mask.

BACKGROUND OF THE INVENTION

For producing semiconductor devices, in particular silicon semiconductor devices, so-called photolithographic methods may, for instance, be used.

With these methods, the surface of a corresponding wafer—consisting of monocrystalline silicon—is subject to an oxidation process, and subsequently a light-sensitive photoresist layer is applied to the oxide layer.

Subsequently—by interconnecting an appropriate optical device—a photomask is placed above the wafer, the layout structure of which corresponds to the layout structure to be provided on the wafer—or a particular level of the wafer.

Then, the photomask—and thus also the corresponding structure on the photoresist—is exposed, and then the photomask is removed again.

When the photoresist is then developed and subject to an etching process, the exposed positions of the photoresist (and the respective positions of the oxide layer thereunder) are removed from the wafer—and the non-exposed positions are left (or—in the case of negative photoresist—in a correspondingly opposite manner the exposed positions).

Through the exposed windows, the monocrystalline silicon can now specifically be supplied with impurities, e.g. by corresponding diffusion or ion implantation processes; n-conductive regions may, for instance, be produced by the introduction of pentavalent atoms, e.g. phosphorus, and p-conductive regions may be produced by the introduction of trivalent atoms, e.g. boron.

The structures that can be put into practice by means of such photolithographic methods may range within the wavelengths of the light used for exposure.

Conventionally, for each level of the wafer (or for each level of the semiconductor devices or chips to be produced thereon, respectively) respective separate masks with respective different layout structures are used.

For the production of different chips, different mask sets have to be used.

If the chip layout is to be changed for a particular chip, new masks are needed (in particular e.g. a complete, new mask set).

This is of disadvantage especially since the production of masks is costly and expensive.

SUMMARY OF THE INVENTION

The invention provides a novel mask, in particular a photomask, for the production of semiconductor devices, and a novel method for the production of semiconductor devices.

In accordance with one embodiment of the invention, a mask, in particular a photomask, is provided for the production of semiconductor devices, wherein a region—assigned to at least two, and preferably all, semiconductor devices to be produced side by side on a wafer and to be exposed by means of the mask, or, in particular, the entire array or product field region of the mask, is provided completely with a layout structure, in particular with cell structures.

During the exposure of the wafer, partial regions of the mask—that are not required—can be faded out, in particular cell structures that are not required.

The above-mentioned photomask has—vis-à-vis conventional photomasks—i.e., the advantage of a substantially more homogeneous structure.

When the photomask has a defect at a particular position (which is exposed with a standard orientation of the photomask with respect to the wafer), the defect may, by appropriate shifting of the photomask, be shifted to a region that is faded out during exposure.

The above-mentioned photomask may—this is a special advantage—be used for exposing a plurality of different levels—that have, in particular, an identical cell structure—of one and the same wafer.

BRIEF DESCRIPTION OF THE DRAWINGS

In the following, the invention will be explained in detail with reference to the embodiments and drawings. The drawings show.

DETAILED DESCRIPTION OF THE INVENTION

Figure 1:
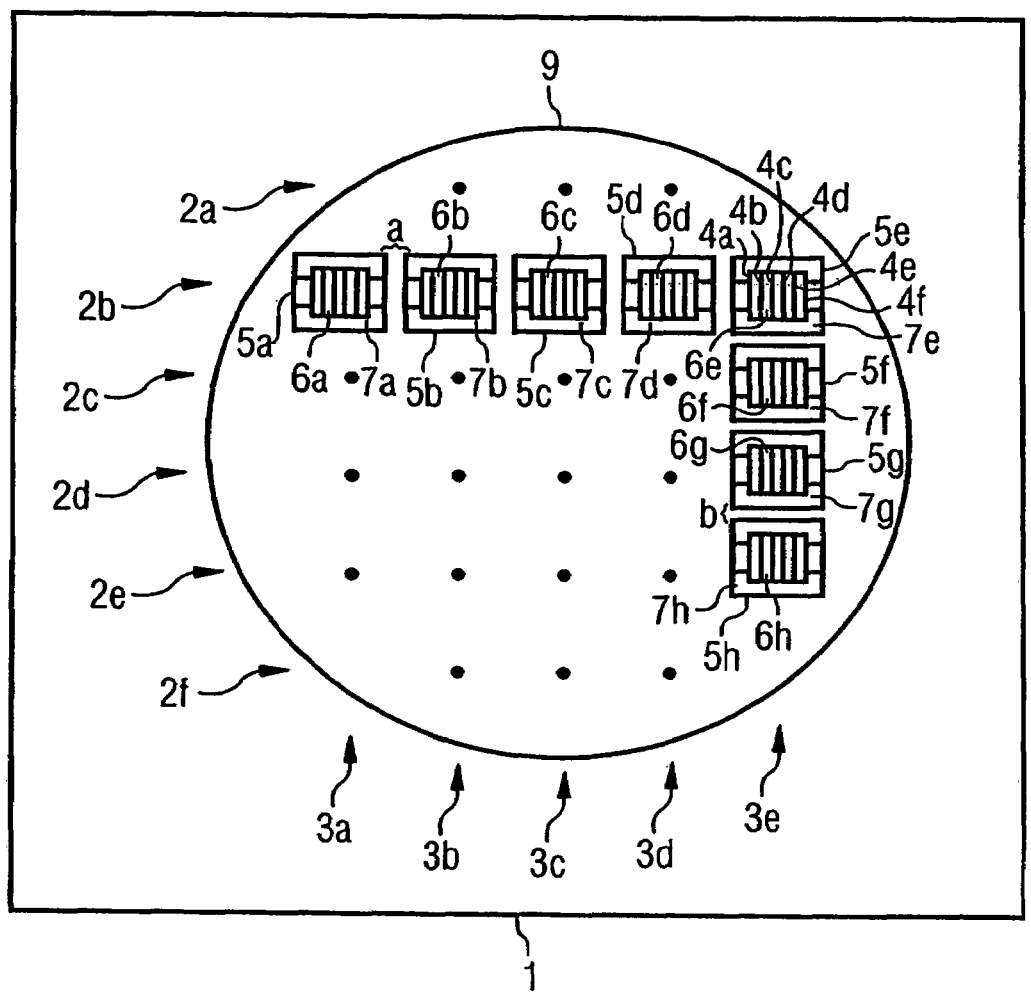
FIG. 1 shows a top view of a conventional photomask.

FIG. 1 is a schematic top view of a conventional photomask 1. The photomask 1 comprises a substrate layer—which is, in FIG. 1, positioned at the bottom—e.g. a quartz layer (or e.g. a crown glass layer, a borosilicate glass layer, etc.), and a masking layer positioned above the substrate or quartz layer, respectively, e.g. a chromium layer (or e.g. an iron oxide layer, etc.).

During the production of the photomask 1, the (top) masking layer, in particular chromium layer, is provided with a layout structure corresponding to the layout structure to be produced later on an appropriate wafer (or a particular level of the wafer, respectively), wherein—by means of an etching process, preferably a plasma etching process, the masking layer, preferably chromium layer, is completely removed at the corresponding positions (cf. e.g. the structure lines 4a, 4b, 4c, 4d, 4e, 4f illustrated (merely schematically) in FIG. 1 and positioned between chromium positions that have been left.

As is illustrated in FIG. 1, the photomask 1 is divided into a plurality of substantially identical, rectangular regions 5a, 5b, 5c, 5d, 5e, 5f, 5g, 5h that are each provided with the same layout structure and are arranged array-like side by side in rows 2a, 2b, 2c, 2d, 2e, 2f and columns 3a, 3b, 3c, 3d, 3e (and forming together an array region 9) (In FIG. 1, the photomask regions positioned in rows 2b, 2c, 2d, and 2e and in the columns 3a, 3b, 3c 3d and 3e corresponding to the photomask regions 5a, 5b, 5c, 5d, 5e, 5f, 5g, and 5h are illustrated, remaining photomask regions are partially illustrated by means of appropriate dots).

Each of the above-mentioned photomask regions 5a, 5b, 5c, 5d, 5e, 5f, 5g, 5h is used for the exposure of a particular, individual semiconductor device or chip to be produced on the wafer.

The semiconductor devices may, for instance, be appropriate logic and/or memory devices, e.g. ROM or RAM memory devices, in particular DRAMs.

Central regions 6a, 6b, 6c, 6d, 6e, 6f, 6g, 6h that are substantially identical, rectangular, and each have the same layout structure (here the above-mentioned structure lines 4a, 4b, 4c, 4d, 4e, 4f) are each positioned centrally in the corresponding photomask regions 5a, 5b, 5c, 5d, 5e, 5f, 5g, 5h.

These may serve, for instance—with particular, individual memory devices to be produced on the wafer—for the exposure of regions on which the—actual—memory device memory cells are produced ("cell regions" 6a, 6b, 6c, 6d, 6e, 6f, 6g, 6h).

The structure lines 4a, 4b, 3c, 4d, 4e, 4f positioned in the corresponding "cell regions" 6a, 6b, 6c, 6d, 6e, 6f, 6g, 6h and illustrated in FIG. 1 may, for instance, be substantially parallel to one another and may, for instance, each have a width and/or a mutual distance of e.g. approx. 30 nm-600 nm, in particular 50 nm-250 nm (wherein the width or the mutual distance of the structure lines 4a, 4b, 4c, 4d, 4e, 4f may—depending on the optical device that is later on connected between a corresponding wafer and the photomask 1—e.g. correspond (with 1:1 photomasks) to the breadth and/or the mutual distance of circuit paths to be produced —later on—on the wafer by means of the photomask 1, or (with 4:1 photomasks) e.g. to a four-fold thereof, etc., etc.

As is further illustrated in FIG. 1, around the central regions ("cell regions") 6a, 6b, 6c, 6d, 6e, 6f, 6g, 6h—and likewise in the above-mentioned photomask regions 5a, 5b, 5c, 5d, 5e, 5f, 5g, 5h (used for the exposure of particular, individual semiconductor devices)— there are positioned substantially identical, frame-shaped, regions 7a, 7b, 7c, 7d, 7e, 7f, 7g, 7h that are also provided with the same layout structure each.

These may, for instance, serve for the exposure of regions on the wafer on which the structures surrounding the—actual—memory device memory cells, possibly connected thereto, are produced (e.g. corresponding (connecting or pad) logic devices, (connecting) lines, spines, kerfs, etc. serving for connection of the memory cells to the outside) ("non-cell regions" 7a, 7b, 7c, 7d, 7e, 7f, 7g, 7h).

In accordance with FIG. 1, the above-mentioned photomask regions 5a, 5b, 5c, 5d, 5e, 5f, 5g, 5h—used for the exposure of particular, individual semiconductor devices— may be arranged in each row 2a, 2b, 2c, 2d, 2e, 2f and column 3a, 3b, 3c, 3d, 3e in vertical and horizontal direction each with certain—equidistant—distances a, b from one another. The regions of the photomask 1 positioned (directly) between the regions 5a, 5b, 5c, 5d, 5e, 5f, 5g, 5h (and resulting from the distances a, b of the regions 5a, 5b, 5c, 5d, 5e, 5f, 5g, 5h from one another) are not used for the exposure of layout structures of the semiconductor devices to be produced on the wafer (but are each assigned to regions on the wafer positioned between the semiconductor devices to be produced and are therefore completely or substantially completely covered with the above-mentioned masking layer, in particular chromium layer).

The conventional photomask 1 illustrated in FIG. 1 is used for the exposure of a particular level or layer, respectively, of the wafer (or the semiconductor devices or chips to be produced thereon, respectively).

For the exposure of the remaining levels or layers (positioned above or below the above-mentioned level or layer) of the semiconductor devices or chips to be produced, further photomasks—that are, in general, in a correspondingly similar way to the photomask 1 illustrated in FIG. 1, divided correspondingly into cell and non-cell regions— with respectively different layout structures are used (e.g. 10 to 40 (in particular 20 to 30) different photomasks for the exposure of 10 to 40 (in particular 20 to 30) different chip levels). For each level of the wafer (or for each level of the semiconductor devices or chips to be produced thereon, respectively) respectively separate photomasks with respectively different layout structures are thus conventionally used.

Figure 2:
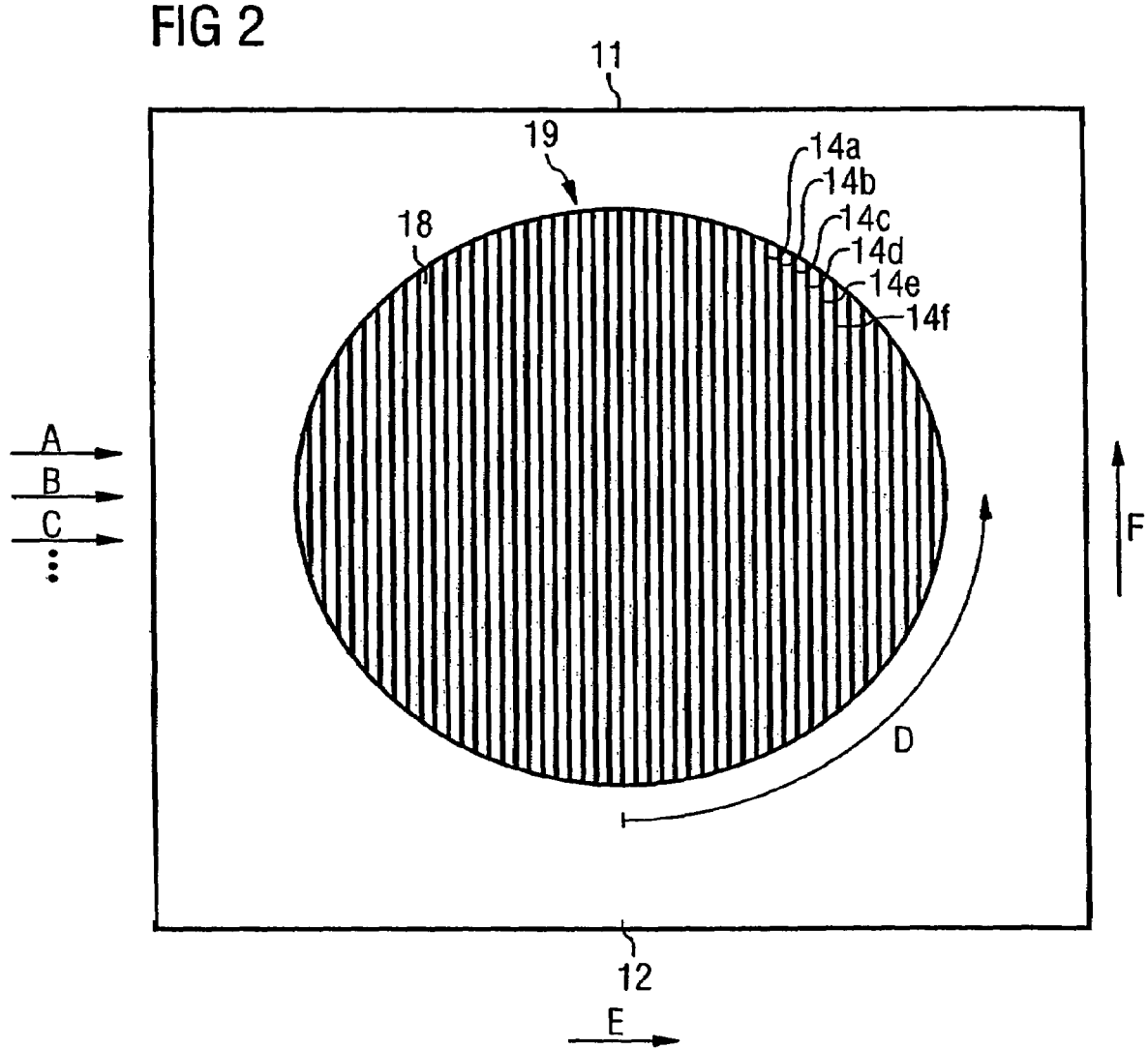
FIG. 2 shows a top view of a photomask according to an embodiment of the present invention.

FIG. 2 shows a schematic view of a photomask 11 in accordance with an embodiment of the present invention.

The photomask 11 serves for the exposure of several semiconductor devices or chips to be produced in corresponding rows and columns side by side on one and the same wafer (or alternatively e.g. only for the exposure of one individual semiconductor device).

The semiconductor devices (or the individual semiconductor device) may, for instance, be (a) corresponding logic and/or memory device(s), e.g. (a) ROM or RAM memory device(s), in particular (a) DRAM(s).

The photomask 11 comprises a substrate layer, e.g. a quartz layer (or e.g. a crown glass layer, a borosilicate glass layer, etc)—positioned, in the drawing according to FIG. 2, at the bottom —, and a masking layer, e.g. a chromium layer (or e.g. an iron oxide layer, etc.) positioned above the substrate or quartz layer, respectively.

During the production of the photomask 11, the (top) masking layer, in particular chromium layer, is provided with a specific layout structure 18 that will still be explained in more detail in the following, wherein—by means of an etching process, preferably a plasma etching process—the masking layer, preferably chromium layer, is completely removed at the corresponding positions (cf. e.g. the structure lines 14a, 14b, 14c, 14d, 14e, 14f (illustrated merely schematically here) of the layout structure 18 positioned between chromium positions that have been left as illustrated in FIG. 1).

As results from FIG. 2, the layout structure 18 (here: its structure lines 14a, 14b, 14c, 14d, 14e, 14f) does not only extend over the respective regions or partial regions used for the exposure of an individual semiconductor device or chip to be produced on the corresponding wafer (corresponding approximately to regions 5a, 5b, 5c, 5d, 5e, 5f, 5g, 5h with the photomask 1 illustrated in FIG. 1, or partial regions thereof, e.g. corresponding cell or non-cell regions 6a, 6b, 6c, 6d, 6e, 6f, 6g, 6h, 7a, 7b, 7c, 7d, 7e, 7f, 7g, 7h), but over the entire array region 19 or product field region of the photomask 11 (or here: over a—circular—region corresponding to the entire wafer to be exposed, or a (somewhat) exceeding—e.g. rectangular—region)—apart e.g. from a mask edge region 12 in which e.g. a compensation structure and/or an alignment structure and/or a barcode structure and/or a PCM (Process Control Monitor) structure and/or a structureless frame region, etc. may be provided.

With alternative embodiments that are not illustrated here, the layout structure may also extend over the entire or substantially the entire region of the photomask 11 (i.e.— other than with the photomask 11 illustrated in FIG. 2—also or partially also over the photomask edge region 12).

The layout structure 18 (here: each of the structure lines 14a, 14b, 14c, 14d, 14e, 14f that are extending continuously in one piece) in particular also extends over regions positioned between the actual regions used for the exposure of the semiconductor devices or chips to be produced on the wafer (e.g. over regions positioned (directly) between regions that correspond to the regions 5a, 5b, 5c, 5d, 5e, 5f, 5g, 5h with the photomask 1 illustrated in FIG. 1, or over regions positioned between regions that correspond to the cell and non-cell regions 6a, 6b, 6c, 6d, 6e, 6f, 6g, 6h, 7a, 7b, 7c, 7d, 7e, 7f, 7g, 7h with the photomask 1 illustrated in FIG. 1).

The structure lines 14a, 14b, 14c, 14d, 14e, 14f of the layout structure 18 illustrated in FIG. 2 may e.g. be positioned substantially parallel to one another and may, for instance, each have a width and/or a mutual distance of e.g. approx. 30 nm-600 nm, in particular 50 nm-250 nm (wherein the width or the mutual line distance may— depending on the optical device connected later on between a corresponding wafer and the photomask 11—e.g. correspond (with 1:1 photomasks) to the breadth and/or the mutual distance of circuit paths to be produced—later on—on the wafer by means of the photomask 11, or (with 4:1 photomasks) e.g. to a four-fold thereof, etc., etc.

When an alternating phase mask is used as photomask 11, the substrate layer, preferably a quartz layer, is etched away down to a predetermined total depth $t_1$ at every second structure line 14a, 14b, 14c, 14d, 14e, 14f produced, as explained above, by appropriate etching, preferably plasma etching, of the masking layer, preferably a chromium layer, by means of an appropriate, further etching process, preferably a plasma etching process.

In the region of the structure lines 14a, 14b, 14c, 14d, 14e, 14f, the substrate layer, preferably a layer, either has a relatively small total depth $t_0$, or a relatively large total depth $t_1$.

When such a photomask is positioned above a corresponding wafer and is exposed, it is achieved that respectively adjacent structure lines 14a, 14b, 14c, 14d, 14e, 14f—and thus light waves passing through correspondingly more or less deep positions of the substrate layer, preferably a quartz layer, are phase-distorted against each other by 180°, whereby—due to interference effects between the light waves—correspondingly more sharply limited intensity maxima of the light waves can be produced on the wafer than with the use of conventional photomasks.

Apart from the above-described types of masks, any further types of photomasks may also be used as photomask 11, e.g. a tritone mask composed of three different layers (e.g. a chromium, a quartz and a phase-shifting layer), etc.

Alternatively, instead of a photomask, also an appropriate non-optical mask may be used, preferably a NGL (Next Generation Lithography) mask, e.g. an ultraviolet mask, in particular an EUV (Extended Ultraviolet) mask, or an IPL (Ion Projection Lithography) mask, etc.

The photomask 11 illustrated in FIG. 2 is—as will be explained in more detail in the following—used for the exposure of partial regions (here in particular e.g. for the exposure of the cell regions) of a particular level or layer of the wafer (or for the exposure of particular partial regions (here in particular e.g. for the exposure of the cell regions) of a particular level or layer of the semiconductor devices or chips to be produced on the wafer)—although the above-mentioned layout structure 18 also extends over non-cell regions (and beyond them).

Figure 3:
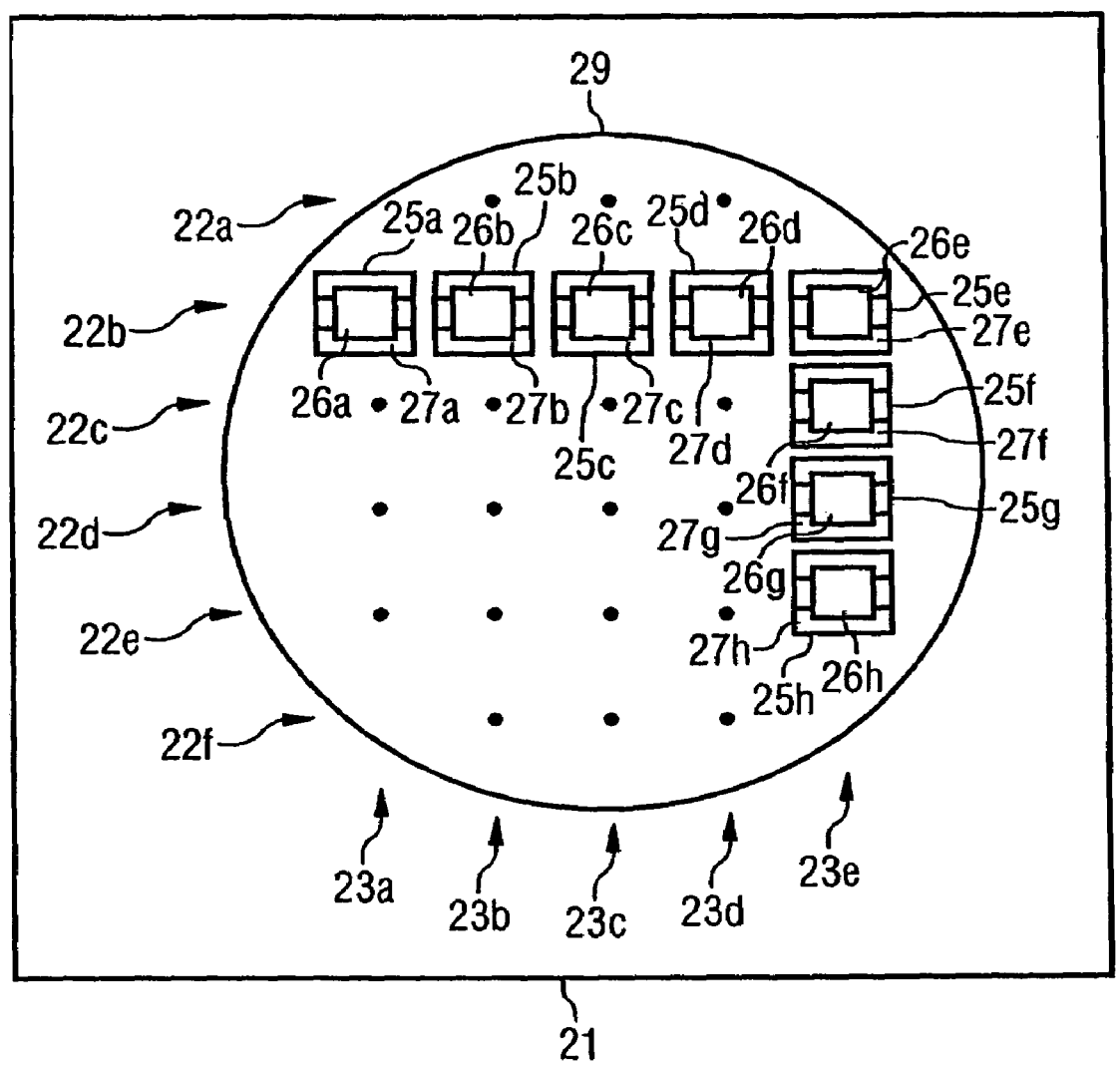
FIG. 3 shows a top view of a further photomask that is used—together with the photomask illustrated in FIG. 2—for exposure of an individual level or layer of a wafer (or the semiconductor devices or chips to be produced thereon, respectively).

For the exposure of the remaining partial regions of the corresponding level or layer of the semiconductor devices or chips to be produced on the wafer, a further photomask corresponding, for instance, to the photomask 21 illustrated in FIG. 3, is used, as will also be explained in more detail further below.

The photomask 11 illustrated in FIG. 2 may—in addition to the exposure of partial regions of the above-mentioned (first) level or layer—also be used for the exposure of partial regions (in particular e.g. for the exposure of the cell regions) of one or a plurality of further levels or layers differing from the above-mentioned level or layer of the wafer (e.g. positioned above and/or below) (e.g. for the exposure of partial regions (in particular e.g. for the exposure of the cell regions) of one or a plurality of further levels or layers of the semiconductor devices or chips to be produced on the wafer)—e.g. for one or a plurality of further levels with correspondingly identical cell (line) structure as the above-mentioned level, or e.g. a cell (line) structure distorted by 90° (cf. explanations below).

For the exposure of the remaining partial regions of the corresponding further level(s) or layer(s) of the semiconductor devices or chips to be produced on the wafer, the above-mentioned photomask corresponding to the photomask 21 illustrated in FIG. 3 is used, or a (third) photomask (not illustrated here) having correspondingly different structures as the photomask 21.

As is illustrated in FIG. 3, the further photomask 21 adapted to be used—together with the photomask 11 illustrated in FIG. 2—for the exposure of an individual level or layer of a wafer (or of an individual level or layer of the semiconductor devices or chips to be produced thereon, respectively) comprises a substrate layer, e.g. a quartz layer (or e.g. a crown glass layer, a borosilicate glass layer, etc.)—positioned at the bottom in the drawing of FIG. 3—and a masking layer, e.g. a chromium layer (or e.g. an iron oxide layer, etc.) positioned above the substrate or quartz layer.

During the production of the photomask 21, the (top) masking layer, preferably a chromium layer, is provided with specific layout structures that will still be explained in more detail in the following, wherein—by means of an etching process, preferably a plasma etching process—the masking layer, preferably a chromium layer, is completely removed at the corresponding positions.

As is illustrated in FIG. 3, the photomask 21 is correspondingly similar to the photomask 1 illustrated in FIG. 1 divided into a plurality of substantially identical, rectangular regions 25a, 25b, 25c, 25d, 25e, 25f, 25g, 25h that are each provided with the same layout structure and are arranged array-like side by side in rows 22a, 22b, 22c, 22d, 22e, 22f and columns 23a, 23b, 23c, 23d, 23e and forming together an "array region" 29 (In FIG. 3, the photomask regions positioned in rows 22b, 22c, 22d, and 22e and in the columns 23a, 23b, 23c, 23d and 23e corresponding to the photomask regions 25a, 25b, 25c, 25d, 25e, 25f, 25g, and 25h are illustrated, remaining photomask regions are partially illustrated by means of appropriate dots).

Each of the above-mentioned photomask regions 25a, 25b, 25c, 25d, 25e, 25f, 25g, 25h (or a respective partial region thereof, cf. below) is—as will be explained in more detail in the following—used for the exposure of a partial region (in particular e.g. of the non-cell region) of a particular, individual semiconductor device or chip to be produced on the wafer.

Central regions 26a, 26b, 26c, 26d, 26e, 26f, 26g, 26h that are of a substantially rectangular shape and that each have, on particular, individual memory devices to be produced on the wafer, assigned regions on which the—actual—memory device memory cells are produced ("cell regions" 26a, 26b, 26c, 26d, 26e, 26f, 26g, 26h) are each positioned centrally in the corresponding photomask regions 25a, 25b, 25c, 25d, 25e, 25f, 25g, 25h, as is illustrated in FIG. 3. Alternatively, several, e.g. four, nine, or sixteen, etc. corresponding (cell) regions—positioned side by side—may also be arranged in each photomask region 25a, 25b, 25c, 25d, 25e, 25f, 25g, 25h instead of one individual central or cell region 26a, 26b, 26c, 26d, 26e, 26f, 26g, 26h.

Other than with the photomask 1 illustrated in FIG. 1, the cell regions 26a, 26b, 26c, 26d, 26e, 26f, 26g, 26h with the photomask 21 according to FIG. 3 are not provided with a layout structure (in particular e.g. not with structure lines)—although the corresponding level or layer, respectively, of the memory devices to be produced on the wafer has to be exposed with a structure, preferably a line structure, at the regions corresponding to the cell regions 26a, 26b, 26c, 26d, 26e, 26f, 26g, 26h (this happens—as will still be explained in more detail in the following—not by means of the photomask 21 illustrated in FIG. 3, but by making use of the photomask 11 illustrated in FIG. 2).

Instead, the photomask 21 is—as illustrated in FIG. 3—completely or substantially completely covered with the above-mentioned masking layer, preferably a chromium layer, at the cell regions.

In accordance with FIG. 3, substantially identical, frame-shaped regions 27a, 27b, 27c, 27d, 27e, 27f, 27g, 27h are positioned around the structureless or substantially structureless central regions ("cell regions") 26a, 26b, 26c, 26d, 26e, 26f, 26g, 26h—also in the above-mentioned photomask regions 25a, 25b, 25c, 25d, 25e, 25f, 25g, 25h (which are each assigned to particular, individual semiconductor devices).

The regions 27a, 27b, 27c, 27d, 27e, 27f, 27g, 27h may be provided with respectively identical or substantially identical layout structures.

These may, for instance, serve for the exposure of regions on the wafer on which the structures surrounding the—actual—memory device memory cells, possibly connected thereto, are produced (e.g. corresponding (connecting or pad) logic devices, (connecting) lines, spines, kerfs, etc. serving, for instance, for connection of the memory cells to the outside) ("non-cell regions" 27a, 27b, 27c, 27d, 27e, 27f, 27g, 27h).

The layout structures provided at the respective regions 27a, 27b, 27c, 27d, 27e, 27f, 27g, 27h of the photomask 21 correspond to corresponding layout structures to be produced at the respective regions of the above-mentioned semiconductor device level or layer, respectively.

The layout structures provided at the respective regions 27a, 27b, 27c, 27d, 27e, 27f, 27g, 27h of the photomask 21 may, for instance, have (minimal) structure widths and/or (minimal) mutual distances of e.g. approx. 30 nm-600 nm, in particular 50 nm-250 nm (wherein the (minimal) structure widths or mutual distances may—depending on the optical device that is later on connected between a corresponding wafer and the photomask 21—e.g. correspond (with 1:1 photomasks) to the (minimal) structure widths or distances of layout structures to be produced—later on—on the wafer by means of the photomask 21, or (with 4:1 photomasks) e.g. to a four-fold thereof, etc., etc.

For the photomask 21, apart from the type of mask described above, any other type of photomask may also be used, e.g. as described above in the connection with the photomask 11 illustrated in FIG. 2—an alternating phase mask or e.g. a tritone mask constructed of three different layers (e.g. a chromium, a quartz, and a phase shifting layer), etc.

Alternatively, instead of a photomask, also an appropriate non-optical mask may be used, in particular a NGL (Next Generation Lithography) mask, e.g. an ultraviolet mask, in particular an EUV (Extended Ultraviolet) mask, or an IPL (Ion Projection Lithography) mask, etc.

In accordance with FIG. 3, the above-mentioned photomask regions 25a, 25b, 25c, 25d, 25e, 25f, 25g, 25h—used for the exposure of particular, individual semiconductor devices—are arranged in each row 22a, 22b, 22c, 22d, 22e, 22f and column 23a, 23b, 23c, 23d, 23e in vertical and horizontal direction each with certain—equidistant—distances from one another. The regions of the photomask 21 positioned (directly) between the regions 25a, 25b, 25c, 25d, 25e, 25f, 25g, 25h (and resulting from the distances of the regions 25a, 25b, 25c, 25d, 25e, 25f, 25g, 25h from one another) are not used for the exposure of layout structures of the semiconductor devices to be produced on the wafer (but are each assigned to regions on the wafer positioned between the semiconductor devices to be produced and are therefore completely or substantially completely covered with the above-mentioned masking layer, preferably a chromium layer).

With alternative embodiments, the photomask regions 25a, 25b, 25c, 25d, 25e, 25f, 25g, 25h may also be positioned directly adjacent to one another—without a distance therebetween.

The photomask 21 illustrated in FIG. 3 is—as has already been explained—only used for the exposure of partial regions—in particular e.g. of the non-cell regions (i.e. the structures directly surrounding the—actual—memory device memory cells, possibly connected thereto)—of a particular level or layer of the corresponding semiconductor devices or chips to be produced on the wafer.

To this end, the photomask 21 is positioned between a light source and the corresponding wafer (wherein appropriate optical devices—in particular those comprising an appropriate lens system—may be provided between the light source and the photomask 21 and/or between the photomask 21 and the wafer).

For the—preceding or subsequent—exposure of further partial regions of the same level or layer of the semiconductor devices or chips to be produced on the wafer (in particular for the exposure of the cell regions (i.e. of those regions on which the—actual—memory device memory cells are produced)) there serves—as has already been explained above—the photomask 11 illustrated in FIG. 2.

Since this photomask 11 is—as explained above—completely or over the entire product field or array region 19 provided with the above-mentioned layout structure 18, particular (partial) regions not to be exposed with the photomask 11 (in particular the non-cell regions (and the regions of the array region 19 positioned between different non-cell regions) are faded out during the exposure of the corresponding wafer with the photomask 11.

Figure 4:
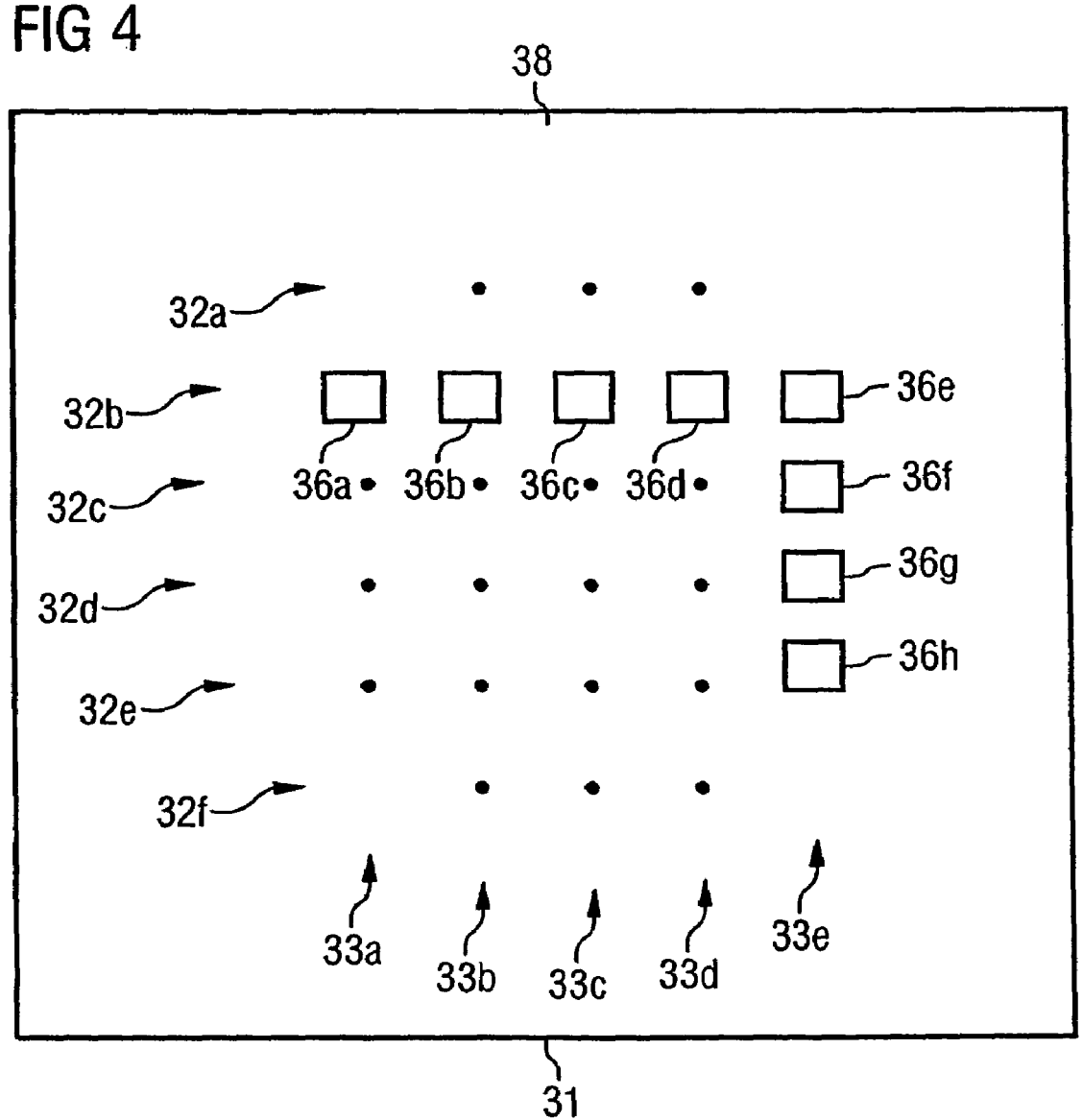
FIG. 4 shows a view of an aperture device used additionally with the exposure of a wafer by using the photomask illustrated in FIG. 2.

To this end, for instance, an aperture means corresponding to the aperture means 31 illustrated in FIG. 4 (viewed from the top there) may be used.

The aperture means 31 is—during the exposure of the wafer with the photomask 11—positioned, for instance, between the wafer and the photomask 11 (e.g. directly above the wafer, or below an optical device positioned between the wafer and the photomask—preferably an optical device comprising an appropriate lens system—, or e.g. directly below the photomask, or above the optical device positioned between the wafer and the photomask, etc.), or, for instance, between the photomask 11 and an appropriate light source (e.g. directly above the wafer, or below an optical device positioned between the light source and the photomask—preferably an optical device comprising an appropriate lens system—e.g. below an appropriate stepper or scanner device).

Alternatively, the aperture device 31 may, for instance, also be part of the optical device positioned above the photomask (in particular an optical device comprising an appropriate lens system), in particular part of the above-mentioned stepper or scanner device (so that an appropriate stepper or scanner aperture is then formed by the aperture device 31).

As is illustrated in FIG. 4, and as will be explained in more detail in the following, the aperture device 31 is designed to be transparent in certain regions 36a, 36b, 36c, 36d, 36e, 36f, 36g, 36h, and otherwise non-transparent (or partially transparent) (non-transparent or partially transparent region 38).

For providing the above-mentioned (transparent or non-transparent (or partially transparent)) regions 36a, 36b, 36c, 36d, 36e, 36f, 36g, 36h, or 38, respectively, the aperture device 31 may, for instance, comprise a transparent layer, e.g. a quartz layer—positioned at the bottom in the drawing of FIG. 4—over the entire face of which (or at least over a region corresponding to the above-mentioned array region 19) a non-transparent layer, e.g. a chromium layer, is positioned, said layer being provided with appropriate recesses at the above-mentioned transparent regions 36a, 36b, 36c, 36d, 36e, 36f, 36g, 36h.

The above-mentioned transparent regions 36a, 36b, 36c, 36d, 36e, 36f, 36g, 36h are substantially identical and, for instance, of rectangular design and are over the entire region corresponding to the above-mentioned array region 19 arranged array-like side by side in rows 32a, 32b, 32c, 32d, 32e, 32f and columns 33a, 33b, 33c, 33d, 33e (In FIG. 4, the regions positioned in rows 32b, 32c, 32d, and 32e and in columns 33a, 33b, 33c, 33d and 33e corresponding to the regions 36a, 36b, 36c, 36d, 36e, 36f, 36g, and 36h are illustrated, remaining photomask regions are partially illustrated by means of appropriate dots).

The transparent regions 36a, 36b, 36c, 36d, 36e, 36f, 36g, 36h correspond in their relative position and their proportions (possibly after appropriate imaging on the wafer by the above-mentioned optical device) to the above-mentioned wafer cell regions on which the—actual—memory device memory cells are to be produced.

The above-mentioned non-transparent region 38 of the aperture device 31 serves—during the exposure of the wafer by means of the photomask 11—for fading out of those regions (here: in particular the non-cell regions and the regions between the non-cell regions) of the wafer that are not to be exposed during the use of the photomask 11.

In other words, the aperture device 31—in particular its non-transparent region 38—prevents rays transmitted by the above-mentioned light source from hitting the above-mentioned non-cell regions.

Contrary to this—due to the transparency of the above-mentioned regions 36a, 36b, 36c, 36d, 36e, 36f, 36g, 36h of the aperture device 31—the remaining partial regions of the wafer (in particular the above-mentioned cell regions) are exposed with the above-mentioned structure 18 provided on the photomask 11.

The fading out of the above-mentioned partial regions, in particular the non-cell regions (and the wafer regions positioned therebetween), and the sole exposure of the remaining partial regions, in particular the cell regions, can, with the use of a mask corresponding to the photomask 11 illustrated in FIG. 2, also be achieved in any other way than with the above-mentioned aperture device 31.

An appropriately designed lithography scanner providing a region-fade-out-function may, for instance, be used for exposure of the wafer.

The use of the photomask 11 in forming a feature using a lithographic scanner is next described. A bundle of rays emitted by the appropriate scanner is directed in a substantially vertical direction from the top on the photomask 11 positioned between the wafer and the scanner. The resulting cone of light is rastered over the face of the photomask 11 along particular scanning directions that are substantially parallel to one another e.g. the scanning directions A, B, and C illustrated in FIG. 2).

Regions positioned vertically relative to the respective scanning directions A, B, C that do not have to be exposed may, for instance, be faded out by corresponding shutters provided at the scanner and extending in horizontal (or e.g. vertical) direction to the scanning direction, and regions positioned horizontally to the respective scanning directions A, B, C—that possibly do not have to be exposed—may be faded out by the scanning gap at the scanner being covered appropriately (completely or partially).

The above mentioned photomask 11 may—contrary to conventional photomasks—be used for the exposure of different levels or layers—having the same structure at the above-mentioned cell regions—of one and the same wafer.

Furthermore, it is possible to use the above mentioned photomask 11 for the exposure of different wafers having partially different structures (e.g., when particular levels or layers of the wafers have the same structure at the above-mentioned cell regions).

Moreover, the above-mentioned photomask 11 may, for instance, be used for the exposure of levels or layers—having identical structures at the above-mentioned cell regions which are, however, oriented in a way distorted vis-à-vis one another (in particular having identical structures apart from a 90° rotation)—of one and the same wafer, or for the exposure of—different—wafers having partially different structures (namely when particular levels or layers of the wafers have the same structure, apart from a rotation, in particular a 90° rotation, at the above-mentioned cell regions).

During exposure, the photomask 11 may be rotated, for example, by 90 degrees to align with the orientation of the respective target structure (cf. Arrow D, FIG. 2).

As results, for instance, from FIGS. 2 and 3, the photomask 11 has—as compared to conventional photomasks 1—moreover i.e., the advantage that it is of substantially more homogeneous structure than conventional photomasks.

When the photomask 11 has, at a particular position (which is exposed with respect to the wafer with a standard orientation of the photomask 11), the defect may, by appropriate shifting of the photomask 11 in vertical and/or horizontal direction (e.g. along the Arrow E and/or F illustrated in FIG. 2), be shifted in a region that is faded out during exposure—e.g. by the above-mentioned aperture device 31.

Due to this fact, the photomask 11 may—despite the defect—(still) be used for wafer exposure.

What is claimed is:

1. A mask set for the production of integrated circuit chips, the mask set comprising:
   a first mask comprising a plurality of first features for forming inner cell regions of the integrated circuit chips; and
   a second mask comprising a plurality of second features for forming outer non-cell regions of the integrated circuit chips, wherein the first mask and the second mask do not expose a same region of a wafer.

2. The mask set according to claim 1, wherein the integrated circuit chips comprise memory chips.

3. The mask set according to claim 2, wherein the plurality of first features serves for the exposure of regions of the memory chips on which memory cells of the memory chips are produced.

4. The mask set according to claim 1, wherein the plurality of first features is a structure homogeneously recurring in a longitudinal and/or a transverse direction of the first mask.

5. The mask set according to claim 1, wherein the plurality of first features is a line structure.

6. The mask set according to claim 1, wherein the inner cell regions comprise a line structure with continuous lines.

7. The mask set according to claim 1, wherein the plurality of first features form a region on the first mask, wherein the region extends over an entire face of the first mask, except an edge region on the first mask.

8. The mask set according to claim 7, wherein the edge region comprises an alignment structure and/or a barcode structure and/or a structureless frame region.

9. The mask set according to claim 1, wherein the plurality of first features form a region on the first mask, the region extends over an entire face of the mask.

10. The mask set according to claim 1, wherein the first mask comprises a mask type selected from the group comprising a photo mask, non-optical mask, ultraviolet mask, and Ion Projection Lithography mask.

11. The mask set according to claim 1, wherein the second mask comprises a mask type selected from the group comprising a photo mask, non-optical mask, ultraviolet mask, and Ion Projection Lithography mask.

12. The mask set of claim 1, wherein the plurality of second features form regions for connecting logic devices, pad logic devices, connecting lines, spines or kerfs.

13. The mask set of claim 1, wherein the first mask and second mask are exposed together to form composite patterns.

14. The mask set of claim 1, further comprising an aperture device comprising a non-transparent fadeout region for fading out at least a part of the first features of the first mask.

15. The mask set of claim 14, wherein the aperture device fades out first features over the non-cell regions.

16. An exposure system using the mask set of claim 1, the exposure system comprising:
   a light source disposed above a wafer holder, wherein the first mask is disposed between the light source and the wafer holder; and
   an aperture device comprising a plurality of third features disposed between the light source and the wafer holder, wherein the plurality of third features fade out a part of the plurality of first features from exposing.

17. The exposure system of claim 16, wherein the faded out regions form non-cell regions of an integrated circuit chip.

18. The exposure system of claim 17, wherein a region, excluding the faded out regions, forms cell regions of the integrated circuit chip.

19. The exposure system of claim 16, wherein the plurality of first features is a structure homogeneously recurring in a longitudinal and/or a transverse direction of the mask.

20. The exposure system of claim 19, wherein the structure comprises lines.

21. A method for the production of integrated circuit chips comprising exposing a wafer using the mask set of claim 1.

22. The method according to claim 21, further comprising fading out partial regions of the first mask during exposure of the wafer.

23. The method according to claim 22, wherein a separate aperture device is used for fading out the partial regions.

24. The method according to claim 23, wherein the faded out regions are exposed by making use of the second mask.

25. A mask set for the production of integrated circuit chips, comprising a first mask and a second mask, the first mask comprising a plurality of first features for forming structured outer non-cell regions of the integrated circuit chips, the second mask comprising a plurality of second features for forming inner cell regions of the integrated circuit chips, wherein the first mask and the second mask do not expose a same region when aligned over a wafer.

26. The mask set of claim 25, wherein the structured outer non-cell regions are identical.

27. The mask set of claim 26, wherein the identical structured outer non-cell regions are selected from the group comprising connecting logic devices, pad logic devices, connecting lines, spines, or kerfs.

28. The mask set of claim 25, wherein the inner cell regions comprise memory cell arrays.

29. A mask set for the production of integrated circuit chips, the mask set comprising:
   a first mask comprising a layout structure; and
   an aperture device comprising a non-transparent fadeout region for fading out at least a part of the layout structure of the first mask, wherein the first mask and the aperture device are exposed simultaneously in an exposure system.

* * * * *